US008638902B2

(12) United States Patent
Moran et al.

(10) Patent No.: US 8,638,902 B2
(45) **Date of Patent: *Jan. 28, 2014**

(54) METHODS FOR INTERRUPTED COUNTING OF PARTICLES IN CELLS

(75) Inventors: Dov Moran, Kefar Saba (IL); Avi Klein, Tel Aviv (IL); Itzhak Pomerantz, Kefar Saba (IL); Menahem Lasser, Kohav Yair (IL); Eyal Bychkov, Hasharon (IL); Eran Leibinger, Bazra (IL); Avraham Meir, Rishon Lezion (IL)

(73) Assignee: SanDisk IL Ltd., Kfar Saba (IL)

( * ) Notice: Subject to any disclaimer, the term of this patent is extended or adjusted under 35 U.S.C. 154(b) by 0 days.

This patent is subject to a terminal disclaimer.

(21) Appl. No.: 13/488,399

(22) Filed: Jun. 4, 2012

(65) Prior Publication Data

US 2012/0243654 A1 Sep. 27, 2012

Related U.S. Application Data

(63) Continuation of application No. 12/113,293, filed on May 1, 2008, now Pat. No. 8,204,169.

(60) Provisional application No. 60/917,937, filed on May 15, 2007.

(51) Int. Cl.
*G06M 11/00* (2006.01)

(52) U.S. Cl.
USPC .................................... 377/6; 377/10; 377/25

(58) Field of Classification Search
None
See application file for complete search history.

(56) References Cited

U.S. PATENT DOCUMENTS

| | | | | |
|---|---|---|---|---|
| 5,032,715 | A | 7/1991 | DeLise | 250/222.2 |
| 5,740,104 | A | 4/1998 | Forbes | 365/185.03 |
| 5,959,896 | A | 9/1999 | Forbes | 365/185.33 |
| 6,501,676 | B1 | 12/2002 | Bandyopadhyay et al. | 365/151 |
| 6,563,901 | B2 * | 5/2003 | Wooldridge | 377/11 |
| 6,982,403 | B2 | 1/2006 | Yang et al. | 250/208.1 |
| 7,917,315 | B1 | 3/2011 | Benckenstein et al. | 702/63 |
| 2001/0038135 | A1 | 11/2001 | Forbes et al. | 257/405 |
| 2001/0040820 | A1 | 11/2001 | Forbes et al. | 365/185.03 |
| 2002/0018373 | A1 | 2/2002 | Ahn et al. | 365/189.07 |

(Continued)

OTHER PUBLICATIONS

Makihara et al. "Characterization of electronic charged state of P-doped Si quantum dots using AFM/Kelvin probe" in Thin Solid Films, 2006, b. 508, No. 1-2, pp. 186-189, (2005).

(Continued)

*Primary Examiner* — Tuan T Lam
(74) *Attorney, Agent, or Firm* — Martine Penilla Group, LLP

(57) ABSTRACT

A method executed by a circuit for counting electrons in storage cells in an array of at least two storage cells is provided. The method includes providing a storage array of at least two storage cells, and each of said at least two storage cells containing an unknown amount of electrons. A receiving array of at least two receiving cells is provided, where said at least two receiving cells initially contain no electrons. Then, extracting a layer of said electrons from said storage array of cells and inserting said layer into corresponding locations in said receiving array. The method then repeats said steps of extracting and inserting while at least one of said at least two storage cells is not empty. The method counts, for each said storage cell in said storage array, a productive-extraction amount.

18 Claims, 11 Drawing Sheets

36 24 34 20 26 22 30 32 36 34 34

(56) References Cited

U.S. PATENT DOCUMENTS

| | | | | |
|---|---|---|---|---|
| 2002/0021589 | A1 | 2/2002 | Ahn et al. | 365/189.07 |
| 2002/0041519 | A1 | 4/2002 | Ahn et al. | 365/185.29 |
| 2002/0104291 | A1 | 8/2002 | Kondou et al. | 53/443 |
| 2002/0151173 | A1 | 10/2002 | Ahn et al. | 438/675 |
| 2003/0235081 | A1 | 12/2003 | Forbes | 365/185.28 |
| 2005/0199947 | A1 | 9/2005 | Forbes | 257/325 |
| 2007/0091661 | A1 | 4/2007 | Forbes | 365/94 |
| 2011/0153240 | A1 | 6/2011 | Benckenstein, Jr. et al. | 702/63 |

OTHER PUBLICATIONS

Matsumoto et al, "Applications of STM Nanometer-Size oxidation Process to Planar-Type MIM Diode" Japanese Journal of Applied Physics, 34, 2B, pp. 1387-1390 (1995).

* cited by examiner

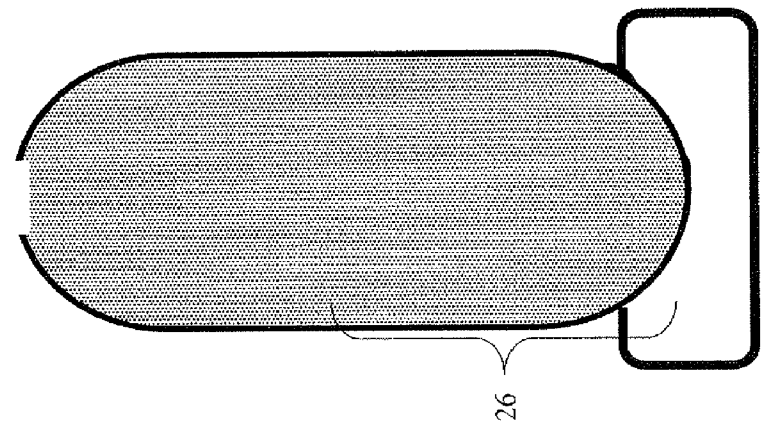
Figure 1C
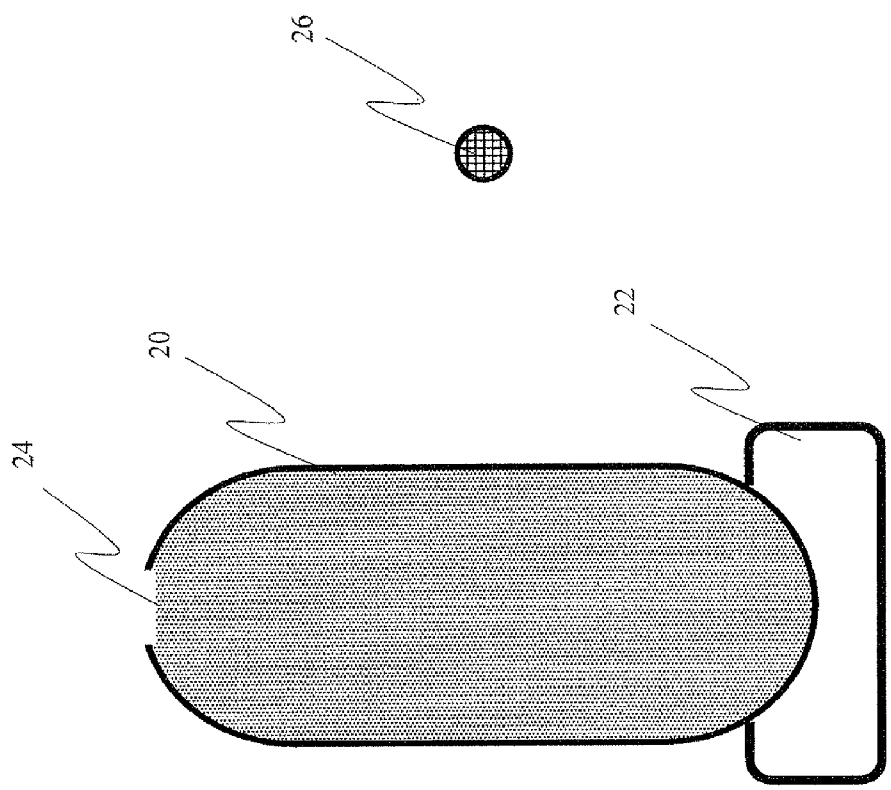
Figure 1B
Figure 1A

Supply Container 50
26
26
52
20
24
22

22
20
52
26
24
26
22
20
24

E

METHODS FOR INTERRUPTED COUNTING OF PARTICLES IN CELLS

CLAIM OF PRIORITY

This application is a Continuation Application under 35 USC §120 of U.S. application Ser. No. 12/113,293 (now U.S. Pat. No. 8,204,169) entitled "Methods and Systems for Interrupted Counting of Items in Containers," filed on May 1, 2008, and which claims priority under 35 U.S.C. §119(e) to U.S. Provisional Application No. 60/917,937, filed May 15, 2007, both of which are herein incorporated by reference.

FIELD AND BACKGROUND

Embodiments described herein relate to methods and systems for interrupted counting of items in containers.

Representing a numerical value by a countable collection of items is a well-known method for information storage, and has been implemented in devices, such as abacuses and ballot boxes, since calculations were performed in ancient times. In the case of the abacus, a number is represented by beads on a bar. When more than one numerical value has to be stored at the same time, the straightforward method is to use multiple containers, and in the case of the abacus, multiple bars of beads.

The stored number of items in a container can be read in several way, including:

(1) (a) looking into the container; and
  (b) visually counting the number of items;
(2) (a) pouring the items out of the container so that the items are easily exposed for counting;
  (b) segmenting the area in which the items are located;
  (c) counting the number of items in each segment; and
  (d) summing the count of items in each segment to arrive at the total number of items; and
(3) (a) weighing the container with the items;
  (b) subtracting the weight of the empty container; and
  (c) dividing the total item weight by the weight of a single item.

When accurate counting is required, and the items are not visible from outside the container, a practical method for counting is to sequentially extract the items from the container, ensuring that each extraction corresponds to exactly one object, and counting the extractions. Such a method is used in situations that require counting accuracy (e.g., for counting envelopes in a ballot box).

Such a method of counting by extraction is useful when there is a single container. However, when there is a plurality of containers containing the same type of items, such a method is very sensitive to interruptions. An interruption, such as a sudden gust of wind that could move everything that is not secured within the container, could cause the counting agent (i.e., the person counting the items) to lose count of the items.

When a large number of containers are being counted simultaneously (i.e., one item is extracted from every container in each cycle of counting until all the containers are empty) an interruption could interfere with and ruin the count. There are many cases in which large numbers of containers have to be counted mechanically and simultaneously, and therefore the conventional counting methods, which are not immune to interruptions that disrupt the count of unprotected items, are problematic. An example for such interruption is a sudden loss of power in a counting system that stores the number of successful extractions in a volatile memory.

It would be desirable to have methods and systems for interruptible counting of items in a plurality of containers.

SUMMARY OF THE INVENTION

Various embodiments can advantageously provide methods and systems for interrupted counting of items in containers. Examples of such methods and systems are provided herein.

For the purpose of clarity, several terms which follow are used as set forth herein. The term "interruptible system" is used herein to refer to a system that is susceptible to an interruption that disrupts a process, and as a result, erases all the information, associated with the process, that is not stored in a non-volatile memory. An interruptible system that needs to preserve its memory is adapted to perform processes in a way that will enable the system to recover from such interruptions. The term "item" is used herein to refer to any object that can be stored in a container. Examples of items include marbles in a mechanical container, and charged particles in an electronic container (i.e., a flash-memory storage device). The term "counting", of a phenomenon or occurrence by a system, is used herein to refer to counting repetitions of a signal that is available to the system, and that has a 1:1 relationship with the phenomenon or occurrence.

The term "countable container" is used herein to refer to a non-volatile container capable of storing a number of discrete items. The term "container column" is used herein to refer to a set of containers, typically linear or planar, each containing any number, zero or more, of items that are arranged so that items can be extracted from the containers substantially simultaneously (in a single parallel operation). The term "column array" is used herein to refer to a set of columns such that items can be moved from one column to another column in the column array.

The term "layer" is used herein to refer to a collection of items that are being picked simultaneously in one extraction from a column array. All the items that are picked together, one from each container, belong to the same layer.

The term "layer of items" is used herein to refer to a binary array (corresponding to an array of containers) having logic 'one' in positions representing a productive extraction of an item, and logic 'zero' in positions representing a non-productive extraction of an item. Typically, if an array of containers has a different number of items initially in two or more containers, then some of the containers will become empty upon repetitive extractions (i.e., layer by layer), and the corresponding positions in the layer will have a logic 'zero'.

The term "storage container" is used herein to refer to a container, containing items, which can be emptied by the extraction of items from the container. The term "receiving container" is used herein to refer to a container that is in the process of being filled with items. The term "supply container" is used herein to refer to a container, containing a large and unknown number of items, that is used as a source of items in a container-duplication process. The term "copy container" is used herein to refer to a container that is initially empty and is used for creating a duplicate of a storage container.

The term "productive extraction" is used herein to refer to an extraction operation performed on a storage container in which the extraction yields an item. The term "non-productive extraction" is used herein to refer to an extraction operation performed on a storage container in which the extraction does not yield an item (e.g., if the container is empty, or if the extraction fails to withdraw an item).

The term "port" is used herein to refer to a discrete location in a container through which items can be extracted and/or inserted. For mechanical containers, the port can be an opening on the periphery of the container. The port can be as small as the size of a single item, and can be as large as a significant portion of the surface area of the container. In electronic devices, the port can be a voltage barrier that is (1) high enough to prevent charged particles (e.g., electrons) from crossing the barrier without application of a suitable voltage, and (2) low enough to enable charged particles to cross the barrier when a suitable voltage is applied.

While conventional counting techniques may appear to relate to the embodiments described herein, it is stressed that the methods and systems described herein are operative in interruptible systems in which power may fail and volatile data may be lost. In contrast, conventional counting techniques do not provide any recovery capability from a power failure in such systems, rendering such techniques ineffective as reliable counting methods.

Embodiments described herein teach methods for counting a large number of items distributed among a large number of containers, by substantially parallel extraction of the items from the containers which is substantially independent of (insensitive to) interruptions that would normally interfere with conventional counting methods.

In an interruptible system, each countable container is typically associated with a receiving container that is initially empty (i.e., when the counting process begins). The counting process utilizes iterative steps in which one item is extracted from the countable container, and one item (the same item or another item, concurrently or sequentially) is inserted into the receiving container. The system counts the number of productive extractions from each countable container. When all the countable containers are empty, the number of productive extractions from each countable container is deemed to be the number of items in the respective receiving container.

If the extraction process is interrupted, and thus causes the count of extractions to be erased, the system can recover from such an error by returning all the items in the receiving containers to the respective countable containers and restarting the counting process.

This system assumes that upon recovery from such an interruption it knows which countable container was associated with which receiving container. However, the magnitude of the interruption can be disruptive to the extent that the system loses the link between the receiving containers and the associated countable containers (hereinafter referred to as "extracted containers").

Accordingly, as described herein (regarding FIG. 3), the interruptible system is protected against such disruptive interruptions by storing, in a non-volatile memory, a record of the identity of the extracted and receiving containers. Upon beginning the counting process, the system stores a record of the identity of the two containers in a reliable location. The system then begins extracting items from the countable container, and inserting items into the receiving containers. If, during this process, an interruption occurs, and as a result, the system loses track of the identity of the two containers, then upon the process recommencing, the system retrieves the identity of the two containers from the reliable location, identifies the two containers, pours the contents of the receiving container back into the countable (i.e., extracted) container, and restarts the counting process.

The "reading" (i.e., counting of items) of the vector of countable containers can be performed with a single mechanism that has one "extraction tool" (or "extraction arm") per countable container. Upon activation of such a parallel-extraction mechanism, all the arms are inserted into the countable containers, and are prompted to attract a single item each (assuming the containers are not empty). The attraction of a single item to the arm can be performed, for example, utilizing a mechanical gripper having a gripping volume that can accommodate only a single item at a time, by a magnetic pick-up that can only hold the weight of a single item at a time, or by a suction cup that can accommodate a single item only. The extraction mechanism can then insert the item into the corresponding receiving container in the receiving array.

In another embodiment described herein, the system includes a mechanism to avoid excessive wear by preventing the above-mentioned arms from trying to extract items from counting containers that were already found to be empty. The maximum number of items in a container may be high (e.g., 500 items). The number of containers in a vector can also be high (e.g., 1,000 containers). If the containers are about half full, then there are about 250,000 items (in the exemplary case) to be extracted from the vector upon being "read".

As an example, if an extraction mechanism without a wear-reducing mechanism is operated 500 times, in order to accommodate a container that is full, the statistical expectation is that the mechanism performs 250,000 non-productive extractions in which the arms come out of the containers "empty-handed" (in the exemplary case).

Such unnecessary wear can be reduced by the system conveying to the extraction mechanism when a countable container is empty, and no longer needs to be visited during the current reading process. Such an indication can be performed by a wear-reducing extraction mechanism that has the ability to de-activate arms that correspond to the indicated containers. In this embodiment, the mechanism operates until all the containers are empty; each arm operates for the required number of extractions only.

In some embodiments, the countable containers are arranged in a two-dimensional array of columns and rows. The reading can be accelerated by providing a mechanism that can extract items in parallel from a series (either columns or rows). For the purpose of describing this embodiment, it is assumed that the columns of the array are vectors of containers to be read simultaneously. According to the above-mentioned embodiments, the reading of a countable-container vector requires the allocation of an empty receiving vector. Therefore, one column of the array will be assigned to be read, and another column of the array will be assigned as a vector of receiving containers.

In some embodiments (regarding FIGS. 4A-C), the system optimizes the counting process when the maximum capacity of the countable container, in terms of the number of items it can hold, is fixed and known. Such embodiments are useful when there is a relatively large difference between the duration of extracting an item from a container and the duration of inserting an item into a container. For example, consider that it takes $t_i$ seconds to place an item into a container, $t_o$ seconds to extract an item from a container, $t_e$ seconds to empty a container by pouring out the items, and $t_f$ seconds to fill a container by pouring in the items.

If $t_i<t_o$, and if the number of items in the container is a random variable with an even distribution in the range of 0 to n, then, if $t_o*0.5n>t*0.5n+t_e$, the preferred method for counting the items in the container is to fill the container to its maximum capacity while counting the number of items needed to fill the container, and then subtract the number counted (in filling the container) from the maximum capacity. This provides the number representing the amount of items in the container. Since a "read" operation ends with an empty container, in this mode, the system then pours out the contents of the container without counting. If, on the other hand, $t_o*0.5n \leq t_i*0.5n+t_e$, then the optimal method for counting the items in the container is to extract items one by one.

Using a similar logic, filling an empty container to a predetermined number of items can be performed using the following two methods:

(1) starting with an empty container, and filling the container one item at a time; or (2) pouring items into the container up to its maximum capacity, and then extracting the items from the container one at a time.

Assuming again that the number to be "stored" in the container is a random number with an even distribution, method (1) is preferred when $t_i*0.5n<t_o*0.5n+t_f$. If a container has been filled by pouring followed by extracting (method (2)), then the container has to be designated as a "negative" container (i.e., the significant number is the complement of the current number of items). For example, for a container having a maximum capacity for 128 items, 32 items are represented as "32" for a positive container and "96" for a negative container.

If $0.5n*t_i$ and $0.5n*t_o$ are significantly larger than $t_f$ and $t_e$, respectively, then it is always preferable to use whichever is smaller, $t_i$ or $t_o$, for "one-by-one" (i.e., single extraction) operations. For example, if $t_i<t_o$, then it is always faster to "read" by adding items until the container is full, and to "write" by emptying the container, and then adding items one by one while counting the items. If $t_i>t_o$, then it is always faster to read by extracting items one by one until the container is empty, and to write by pouring items in until the container is full, and then extracting the required number of items one by one.

In various embodiments (e.g., as illustrated in FIG. 6), the containers are arranged in pairs. In each pair, one container is used to store the items (i.e., a storage container), and the other container is used as a "buffer" (to hold the items while being counted). At the beginning of each cycle, the storage container has all the items stored in the pair, and the buffer container is empty. Reading is performed by extracting items one by one from the storage container into the buffer container, and counting the steps until the storage container is empty.

In the event that there is a disruption (e.g., extended break in counting or power failure) during the counting process, then, upon recommencing the counting process, the contents of all the buffer containers are poured back into the storage containers, and the reading is restarted. This way, power loss does not destroy the data. This embodiment solves the problem of losing the identity of the active containers by using an extra container (i.e., the buffer container) for each countable container. This means that only half as many containers are available for storing items.

Preferably, the loss of usable countable containers that are designated as buffer containers can be compensated for by using "dedicated" receiving containers for receiving items during counting. Assuming that one empty container is used in all reading operations, upon recovering from a disruption, the system can identify the receiving container, but the system cannot identify the corresponding storage container.

Such a situation is solved by storing the identity of the storage container in a reliable location. Upon recovery from a disruption, the system reads the identity of the storage container, and then pours all the items from the dedicated receiving container to the current storage container, and restarts the reading process. While such a reading mode wears down the dedicated receiving container, operation in such a mode relieves the system from the need to double the number of containers. The wear on the dedicated receiving container can be leveled, to some extent, by switching the designation of the dedicated receiving container to another container periodically, when the dedicated receiving container is empty.

In some embodiments described herein, there is a table that holds a dynamic physical address for each logical countable container. There is a distinction between the physical and the logical address of the countable containers. When a countable container is being read, as described above, the contents of the container is physically transferred to another container. In the present embodiment, upon successful completion of reading, the physical location of the logical address associated with this container is changed to the physical location of the receiving container. Such an embodiment saves the need to return the contents of the extracted container to their original physical position.

In some embodiment described herein (regarding FIGS. 7A-C), an extracted container from one reading process serves as a receiving container for the next reading process. In this way, only one empty container is required for the sequential reading of any number of populated countable containers. If the containers are arranged in a matrix, and the reading process takes place in parallel on a column of containers in the matrix, then the receiving containers can be an empty vector in the matrix, and the extracted vector can become the receiving vector for the next reading cycle.

When certain items are kept in a container for a long time, the items may physically disintegrate and/or disappear. Examples of items susceptible to such deterioration include fruits that can rot, living items that can die or escape, and chemical specimens that may evaporate or sublimate. Long-term storage of such items must take such phenomena into consideration. Some embodiments described herein deal with such "item volatility".

In one such embodiment described herein (regarding FIG. 8), the number to be stored in a container is represented by a grouping of items. For example, the number 12 can be represented by 12 quadruplets as 48 items. If, upon counting, the system finds 47 items in a container, it can be considered that the container was intended to represent the number 12, and that one item has been lost. A reading error occurs only if 4 items are lost in one container. The probability of such a reading error occurring is the fourth power of the probability of loss, which is a negligible probability.

In some embodiments described herein, a storage container can be duplicated into two copy containers that have the same number of items by assigning two receiving containers to each storage container, and sequentially extracting items from the storage container, and inserting an item into each of the two receiving containers (i.e., the copy containers). If a disruption occurs during the process, the system can select one of the two copy containers, pour the contents of the copy container back into the storage container, empty the second copy container, and then restart the process.

In some embodiments described herein, the life expectancy of a storage system based on counting semi-volatile items stored in countable containers is extended indefinitely by periodically reading and rewriting (referred to herein as a "refresh" operation) the contents of the containers, compensating for errors caused by item volatility by "rounding up" the read value to an integer number of groups. The time elapsed between performing successive refresh operations can selected in order to avoid the occurrence of errors.

In some embodiments described herein, the number of items that represent a single "counting unit" is variable. For example, in situations in which information needs to be retained for a very long-time, information is stored by allocating a large number of items per counting unit. In situations in which a lot of information needs to be stored, but some errors can be tolerated, information is stored by allocating a small number of items per counting unit, and storing more counting units in a single container. Clearly, when variably-sized item groupings are used in containers, the size of the grouping must be appropriately stored in order to correctly interpret the number of items in such containers. Such embodiments provide methods for compensating for the volatility of items in the containers.

There may be a difference between the "environmental conditions" suitable for extracting items from containers and inserting items into containers. For example, there may be situations in which there is no practical way to insert an extraction tool into a container. Therefore, the only way to extract items from a container is to flood (i.e., fill) the container with a fluid that has higher specific gravity than the items, causing the items to float on the fluid toward the port of the container, from which the items can be extracted and counted. Similarly, it may not be practical to insert items into containers by laying them in the container with an insertion tool. The only way to insert items may be by bringing the items to a port located at the top of the container, and dropping the items into the container (e.g., a ballot or charity box).

Such a scenario implies that the container cannot be pre-flooded with a fluid that is heavier than the items. In such cases, if single containers are to be read and written, the system would have to switch containers between the "flooded" state and the "drained" state. If flooding and draining take a lot of time, operation of the system would be very slow and high in wear. In an embodiment described herein (regarding FIG. 9), the containers are perforated, covered with lids, and arranged in sub-areas (referred herein as "blocks"). Each block represents a "bath" that can be flooded and drained.

The read and write processes are performed simultaneously on all the containers in a block. The process of reading is performed by closing all the lids of the containers, flooding the bath with a suitably-heavy fluid, waiting for all items to aggregate under the lids, opening the lids (one by one or in parallel), and then letting the items float out of the containers while being counted. The process of writing is performed by draining a block-bath, and then dropping items, one by one, into the empty containers.

Therefore, according to embodiments described herein, there is provided for the first time a method for counting items in storage containers in an array of at least two storage containers, the method including the steps of: (a) providing a storage array of at least two storage containers, each of the storage containers containing an unknown amount of items; (b) providing a receiving array of at least two receiving containers, wherein the receiving containers initially contain no items; (c) extracting a layer of the items from the storage array; (d) inserting the layer into corresponding locations in the receiving array; (e) repeating the steps of extracting and inserting while at least one of the storage containers is not empty; (f) counting, for each storage container in the storage array, a productive-extraction amount; and (g) reporting, for at least some of the storage containers, the productive-extraction amount from each storage container.

Preferably, the step of extracting is performed by extracting the items from a respective port in each storage container.

Preferably, the step of inserting is performed by inserting the items into a respective port in each receiving container.

Preferably, the method further includes the step of: (h) restoring the items from the receiving containers in the receiving array into corresponding storage containers in the storage array.

Preferably, the receiving array is a dedicated receiving array.

Preferably, the items are electrons, and wherein the storage array is an array of cells in a non-volatile memory device.

Preferably, the method further includes the step of: (h) attracting individual the items in the storage containers to an extraction mechanism.

Preferably, the method further includes the step of: (h) storing an identity of the storage array in a non-volatile memory device.

Most preferably, the method further includes the step of: (i) recovering the identity upon recovery from a system failure that erases the productive-extraction amount.

Preferably, the method further includes the step of: (h) subsequent to the step of counting, detecting when the layer is empty.

Preferably, the method further includes the step of: (h) pairing a respective dedicated receiving container to each storage container.

Preferably, the method further includes the step of: (h) converting the storage array, in an initial counting operation, to the receiving array in a subsequent counting operation.

Preferably, a plurality of items is used to represent a single countable unit.

More preferably, the method further includes the step of: (h) applying a substantially-uniform force to the items, thereby causing the items to move toward the respective ports of respective storage containers.

Most preferably, the step of extracting includes extracting a single the layer in extraction procedure.

Most preferably, the items are solid items, and wherein the substantially-uniform force is a buoyancy force applied toward the ports.

Most preferably, the items are electrons, and wherein the substantially-uniform force is an electrical field applied toward the ports.

More preferably, the step of extracting is performed by a plurality of extraction mechanisms, wherein each extraction mechanism has access to the items via the respective ports.

Most preferably, the productive-extraction amount is incremented upon completion of productive extractions performed by the plurality of extraction mechanisms.

Most preferably, each extraction mechanism operates through a different respective port.

Most preferably, at least some of the plurality of extraction mechanisms operates through a common respective port.

According to embodiments described herein, there is provided for the first time a method for counting items in storage containers in an array of at least two storage containers, the method including the steps of: (a) providing a storage array of at least two storage containers, each of the storage containers containing an unknown amount of items; (b) filling each storage container to a respective maximum capacity while counting a respective insertion amount; (c) for each storage container, subtracting the respective insertion amount from the respective maximum capacity to obtain a respective difference; and (d) reporting, for at least some of the storage containers, the respective difference from each storage container.

According to embodiments described herein, there is provided for the first time a method for counting items in storage containers in an array of at least two storage containers, the method including the steps of: (a) providing a storage array of at least two storage containers, each of the storage containers containing an unknown amount of items; (b) providing a receiving array of at least two receiving containers; (c) filling each receiving container to a respective maximum capacity; (d) extracting a storage layer of the items from the storage array; (e) extracting a receiving layer of the items from corresponding locations in the receiving array; (f) repeating the steps of extracting from the storage array and extracting from the receiving array while at least one of the storage containers is not empty; (g) counting, for each storage container in the storage array, a respective productive-extraction amount; and (h) reporting, for at least some of the storage containers, the respective productive-extraction amount of each storage container.

Preferably, the productive-extraction amount corresponds to a difference between a remaining amount in a corresponding receiving container and the maximum capacity of the corresponding storage container.

According to embodiments described herein, there is provided for the first time a method for counting items in storage containers in an array of at least two storage containers, the method including the steps of: (a) providing a storage array of at least two storage containers, each of the storage containers containing an unknown amount of items; (b) providing a receiving array of at least two receiving containers, wherein the receiving containers initially contain no items; (c) extracting a layer of the items from the storage array; (d) inserting the layer into corresponding locations in the receiving array; (e) repeating the steps of extracting and inserting while at least one of the storage containers is not empty; (f) counting, for each storage container in the storage array, a productive-extraction amount; (g) storing an identity of the storage array in a non-volatile memory device; and (h) recovering the identity upon recovery from a system failure that erases the productive-extraction amount.

According to embodiments described herein, there is provided for the first time a non-volatile storage system including: (a) an array of at least two containers; (b) at least one item in at least some of the containers; (c) an extraction mechanism for extracting a layer of items from the array; (d) a counting mechanism for counting a productive-extraction amount from each container; and (e) a controller operative to count an item amount, in any of the containers, by a sequence of: (i) extracting the items from the array; and (ii) counting the productive-extraction amount from each container.

Preferably, the system further includes; (f) a restoring mechanism for restoring the items in the array, upon completing a counting procedure, according to the item amount.

Preferably, a plurality of extraction mechanisms is configured to operate in parallel.

Preferably, the system further includes: (f) a force mechanism for applying a substantially-uniform force to the items, thereby causing the items move toward respective ports of respective containers.

According to embodiments described herein, there is provided for the first time a non-volatile storage system including: (a) an array of at least two containers; (b) at least one item in at least some of the containers; (c) an extraction mechanism for extracting a layer of items from the array; (d) a counting mechanism for counting a productive-extraction amount from each container; and (e) a controller operative to count an item amount, in any of the containers, by a sequence of: (i) extracting the items from the array; (ii) counting the productive-extraction amount from each container; (iii) storing an identity of the array in a non-volatile memory; and (iv) recovering the identity upon recovery from a system failure that erases the productive-extraction amount.

According to embodiments described herein, there is provided for the first time a method of duplicating a container array, the method including the steps of: (a) providing a storage array of at least two storage containers, each of the storage containers containing an unknown amount of items; (b) providing a receiving array of at least two receiving containers, wherein the receiving containers initially contain no items; (c) providing a supply array of at least two supply containers, wherein the supply containers contain a relatively large number of items in each supply container; (d) providing a copy array of at least two copy containers, wherein the copy containers initially contain no items; (e) extracting an item layer of individual items from the storage array; (f) storing logical values of the item layer in a temporary logical memory; (g) inserting the item layer into corresponding receiving containers of the receiving array; (h) extracting a supply layer of individual items from the supply array in accordance with the logical values in the logical memory; (i) inserting the supply layer into corresponding copy containers of the copy array; and (j) repeating the steps (e)-(i) until the item layer is empty.

Preferably, the step (e) is performed by extracting the individual items from a respective port in each storage container.

Preferably, the step (g) is performed by inserting the individual items into a respective port in each receiving container.

Preferably, the method further includes the step of (k) restoring the items from the receiving array into the storage array.

These and further embodiments will be apparent from the detailed description and examples that follow.

BRIEF DESCRIPTION OF THE DRAWINGS

Embodiments are herein described, by way of example only, with reference to the accompanying drawings, wherein:

FIG. 1A is a conceptual representation of an empty container;

FIG. 1B is a conceptual representation of an item;

FIG. 1C is a conceptual representation of a container partially full with items;

DESCRIPTION OF THE PREFERRED EMBODIMENTS

Figures 2A, 2B:
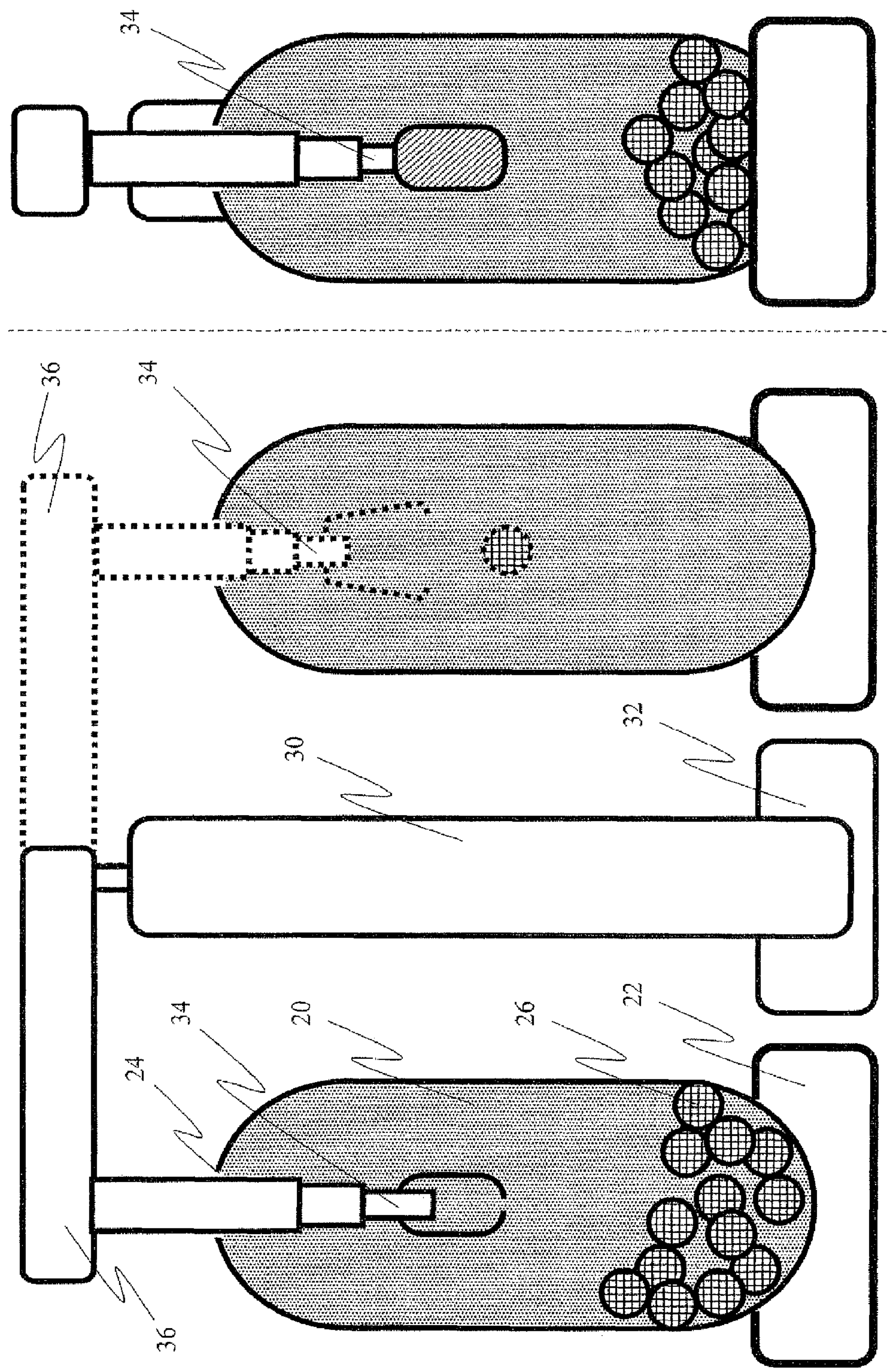
FIG. 2A shows a side view of a conceptual representation of an extraction tool for extracting and filling items in a container.
FIG. 2B shows an end view of the extraction tool of FIG. 2A.

Embodiments described herein relate to methods and systems for interrupted counting of items in containers. The principles and operation for interrupted counting of items in containers, according to embodiments described herein, may be better understood with reference to the accompanying description and the drawings.

Referring now to the drawings, FIG. 1A is a conceptual representation of an empty container. A container 20 is shown positioned on a pedestal 22. FIGS. 1A-C (and subsequent drawings) are referred to as conceptual representations in that the drawings are simplistic schemes intended to convey the features of the method in the various embodiments. Due to the broad utility of the methods, structural features have been conceptually represented so as to allow applicability to many types of item/container systems (e.g., mechanical and electronic containers).

Depending on the nature of a system implementation, pedestal 22 may or may not be present in the system, or may be an integrated component of container 20. Container 20 is shown in FIG. 1A having a port 24. Container 20 can have any commonly-known form (e.g., a barrel or can). Container 20 can also be a cell in a non-volatile memory (e.g., flash memory).

FIG. 1B is a conceptual representation of an item. An item 26 is shown that can easily be inserted in, and extracted from, container 20 via port 24. Item 26 can have any commonly-known form (e.g., a marble, an orange, an egg, and a ballot). Item 26 can also be a charged particle (e.g., an electron).

FIG. 1C is a conceptual representation of a container partially full with items. FIG. 1C shows the container of FIG. 1A partially filled with identical items 26 of FIG. 1B. Container 20 can store items 26 for a relatively extended period of time, and can accommodate counting the number of items 26 in container 20 for ordinary inventory-control purposes. Moreover, container 20 can be one of many is containers in a storage system. Such storage system can accommodate counting items 26 in each and every container 20 in that system.

FIG. 2A shows a side view of a conceptual representation of an extraction tool for extracting and filling items in a container. An extraction apparatus 30, having two or more degrees of freedom, is positioned on an optional apparatus base 32, and situated such that an extraction tool 34 can enter two containers 20 via respective ports 24. Extraction tool 34 and reach down to the bottom of containers 20. Extraction tool 34 can either grab and extract item 26 from container 20, or insert and drop item 26 into container 20. Extraction tool 34 is used to move items 26 individually from one container 20 to another container 20 by rotating an extraction arm 36 from one container 20 to another container 20. FIG. 2B shows an end view of the extraction tool of FIG. 2A.

Extraction tool 34 is can be instrumental in reporting if a container 20 is empty. Upon reaching the bottom of a container 20, and being unable to find an item 26, extraction tool 34 reports to the system that the current container 20 is empty. It is assumed that the bottom of container 20 is concave and the last items 26 will always be found at the center of the bottom of container 20. It should be clear that other mechanisms can be implemented in order for the system to determine if a container 20 is empty (e.g., placing sensors in the container, or visually inspecting the container).

If a controller that manipulates extraction tool 34 counts the number of successful "extract and insert" operations, then when the first container 20 is empty, the controller will know the number of items 26 in the first container 20 when the process began. If the controller then returns the items 26 from the second container 20 to the first container 20, the system will resume its Original state. Such a method of "counting by moving" (CBM) can be implemented with other repetitive operations associated with moving items individually from one container to another while counting the number of movements.

Such a CBM method can be used, for example, for counting oranges in a basket, eggs in a carton, or electrons in a memory cell. In the case of implementing such methods in memory cells, Forbes, U.S. Pat. Nos. 5,740,104 and 5,959,896 (hereinafter referred to as Forbes '104 and Forbes '896, respectively, and incorporated by reference as if fully set forth herein), teaches a multi-state flash memory cell and method for programming single electron differences. Furthermore, techniques utilizing single-electron turnstiles that count electrons one-by-one as the electrons move from container to container are known in the art. Further discussion on techniques for counting single-electron differences are provided in the Techniques section below.

Figure 3:
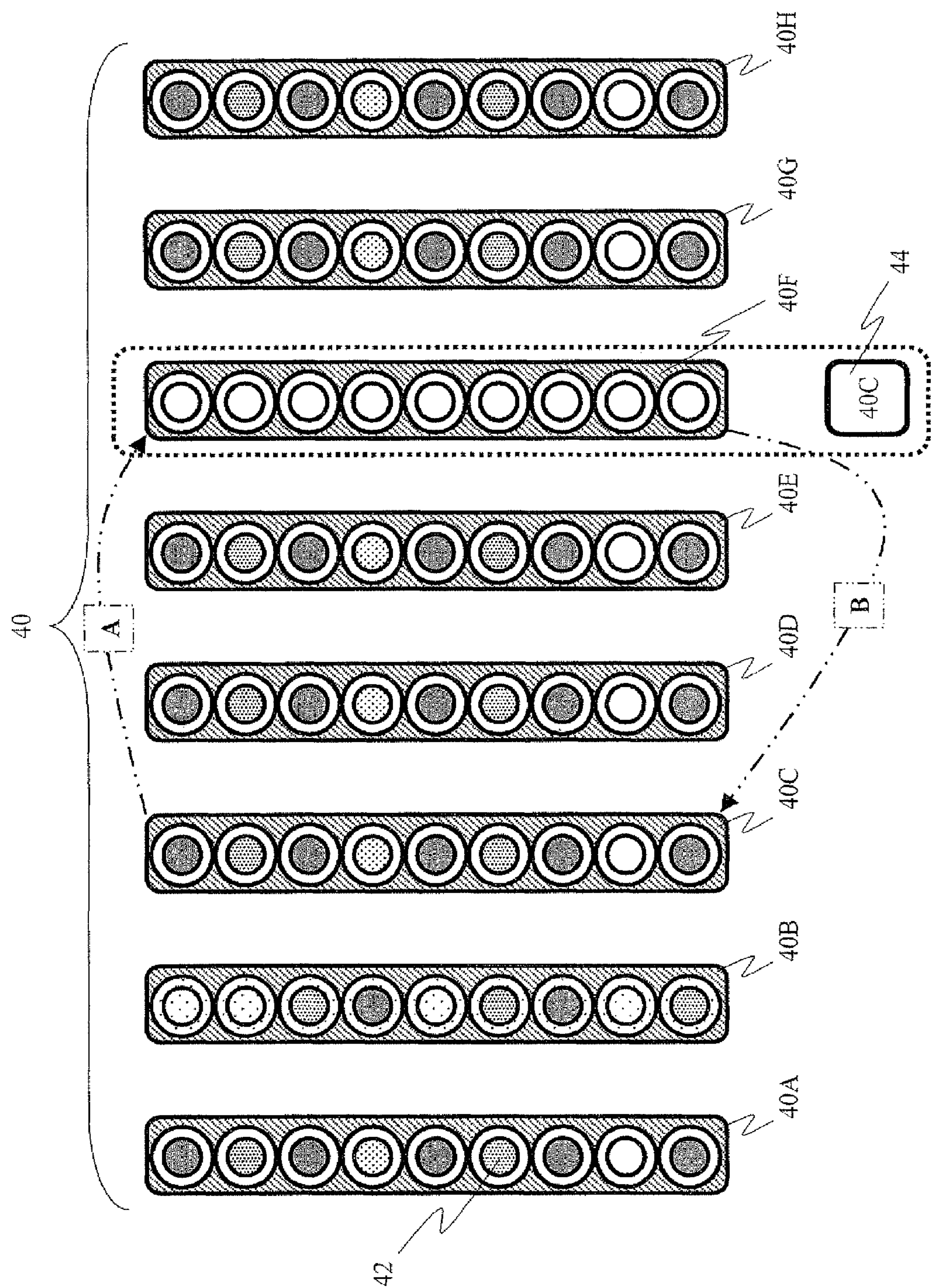
FIG. 3 is a conceptual representation of a system that uses dedicated receiving containers.

FIG. 3 is a conceptual representation of a system that uses dedicated receiving containers. A column array 40, of containers 42, is shown from a top-view perspective. Container columns in column array 40 are labeled with addresses 40A-40H. In the exemplary embodiment of FIG. 3, there are nine containers 42 shown in each of columns 40A-40H.

Some of containers 42 may contain an unknown number of items 26 (represented by shading, and not explicitly shown in FIG. 3). The number of items 26 in all containers 42 of column array 40 can be read by performing, in parallel, the CBM process described with regard to FIG. 2. Initially, all containers 42 of column 40F are intentionally empty. In the exemplary embodiment of FIG. 3, containers 42 of column 40F serve as dedicated receiving containers in the counting process.

The system extracts an individual item 26 from each container 42 of column 40C, and inserts the items 26 into corresponding containers 42 of column 40F. The extraction and insertion steps are depicted as extraction transfer A in FIG. 3. After each productive extraction, the system adds one to the count of items 26 in the each of containers 42 of column 40F. If a container 42 in column 40C is found to be empty, the system stops including that container 42 in the count. When all containers 42 of column 40C are empty, the system stops the extraction process, reports the count for each container 42 of column 40C, and (as a housekeeping procedure) empties all items 26 from containers 42 of column 40F back into corresponding containers 42 in column 40C (depicted as extraction transfer B in FIG. 3).

The process described above with regard to FIG. 3 is sensitive to disruptions that can cause the system to lose the count. An example of such a disruption is a loss of power in a computer system that stores the count in a volatile memory. Such disruptions can result in an uncorrectable error in counting. The system, upon resuming the extraction process, may not know which container 42 was being counted when the disruption occurred, and as a result, may have lost the count, and/or may not know how many items 26 have already been moved from storage containers 42 of column 40C to receiving containers 42 of column 40F.

In some embodiments described herein, such errors can be avoided by storing an ID number (e.g., associated with the addresses of the columns being counted) in a non-volatile location. In implementations in which containers 42 are memory cells, a non-volatile memory cell 44 associated with receiving column 40F can be used to store such ID numbers. Upon resuming operation after a disruption, the system retrieves the identity of storage column 40C from non-volatile memory cell 44, returns all the items 26 from the receiving column 40F to the storage column 40C, and then restarts the counting.

Figures 4A, 4B, 4C:
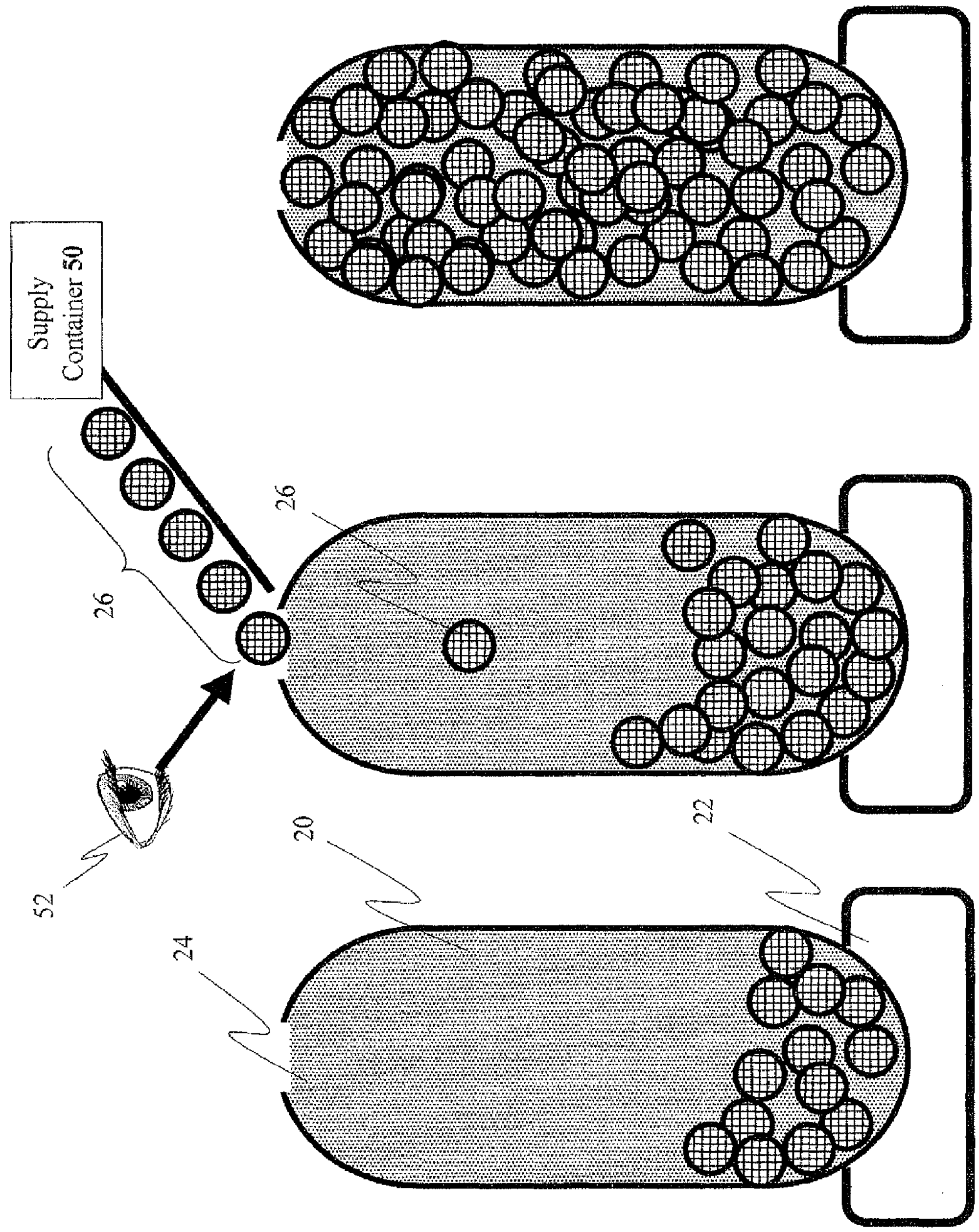
FIG. 4A is a conceptual representation of a partially-full container that is read by filling (RBF)
FIG. 4B is a conceptual representation of the container of FIG. 4A during the RBF process.
FIG. 4C is a conceptual representation of the container of FIG. 4B after the RBF process has been completed.

FIG. 4A is a conceptual representation of a partially-full container that is read by filling (RBF). It is assumed that the maximum number of items 26 that container 20 can hold is fixed and known. The maximum number of items 26 that container 20 can hold is designated as "N" herein.

FIG. 4B is a conceptual representation of the container of FIG. 4A during the RBF process. Assuming that the operation of inserting items 26 into container 20 is a more economical process (e.g. faster or cheaper) than the operation of extracting items 26 from container 20, then the RBF process would be a preferred method for determining the number of items 26 in container 20. A practically unlimited supply of items 26 (obtained from a supply container 50, depicted as a box, and not explicitly shown in FIG. 4B) are used to fill container 20, while being carefully counted upon entry by an inspection mechanism 52. Examples of inspection mechanism 52 include a human operator, a mechanical counter, an optical counter, or a counter of drain current steps as disclosed in Forbes '104 and Forbes '896.

FIG. 4C is a conceptual representation of the container of FIG. 4B after the RBF process has been completed. Since the maximum number of items 26 in container 20 is known, and since the event of not being able to insert another item 26 into container 20 can be sensed by inspection mechanism 52, the system can reliably determine how many items 26 can be inserted into container 20 until container 20 is full (as shown in FIG. 4C). Therefore, by subtracting the number of insertion operations from N, the number of items 26 that were originally inside container 20 can be deduced.

For container 20 to be used as a non-volatile memory, the number of items 26 in container 20 has to be restored to the original number after the counting process is complete. In some embodiments described herein, such a restoration process can be performed using the following two operations:

(1) pouring out all of items 26 from container 20, leaving container 20 empty; and (2) inserting the exact number of items 26 that were counted back into container 20.

Figures 5A, 5B, 5C:
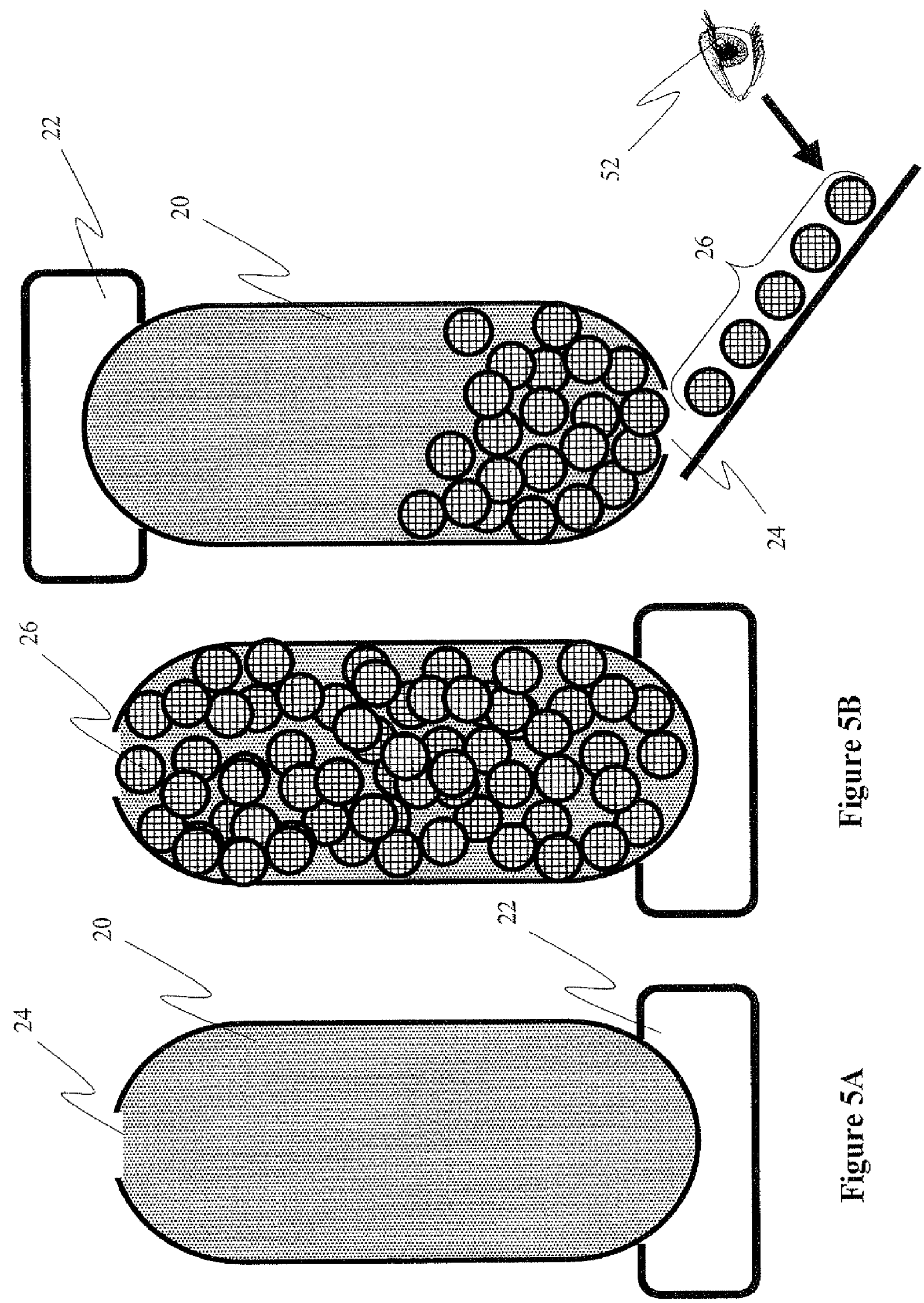
FIG. 5A is a conceptual representation of an empty container that is written by filling and emptying (WBFE.
FIG. 5B is a conceptual representation of the container of FIG. 5A after being filled during the WBFE process.
FIG. 5C is a conceptual representation of the container of FIG. 5B while being emptied during the WBFE process.

FIG. 5A is a conceptual representation of an empty container that is written by filling and emptying (WBFE). Container 20 is initially empty. In implementations in which container 20 is a memory cell, the memory cell is either initialized or erased.

FIG. 5B is a conceptual representation of the container of FIG. 5A after being filled during the WBFE process. The system first fills container 20 to the maximum number, N, without counting. As an example, in implementations in which container 20 is an automotive bus, the filling can be performed by allowing passengers into the empty bus until all the seats are singly occupied with no standing passengers.

FIG. 5C is a conceptual representation of the container of FIG. 5B while being emptied during the WBFE process. The system then extracts a quantity of items 26 from container 20 that is equal to the difference between N and a desired number of items 26. This can be performed, as depicted in FIG. 5C, by turning over container 20 upside-down (or by any other operation that will cause items 26 to individually pour out of container 20 via port 24), while items 26 are counted by inspection mechanism 52. Once the number of items 26 in container 20 is equal to the desired number, the extraction process is stopped, and container 20 is restored to its normal position.

If the configuration of the system does not support an automatic flow of items 26 out of container 20 (e.g., as may be the case in counting chicks in an incubator), container 20 can be emptied using a one-by-one extraction process, while counting the number of productive extractions.

In situations in which the system is disrupted, a problem with losing information arises. In such situations; all information that is not stored as items 26 in containers 20 is lost, including the identity of containers 20, and the number of productive extractions that was counted. Only information that is reflected in the numbers of items 26 in containers 20 is restored in such a case.

Figure 6B:
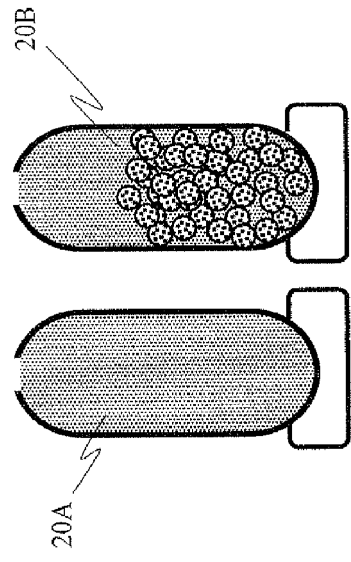
FIG. 6B is a conceptual representation of the paired containers of FIG. 6A after the items have been extracted from the storage container.
Figure 6D:
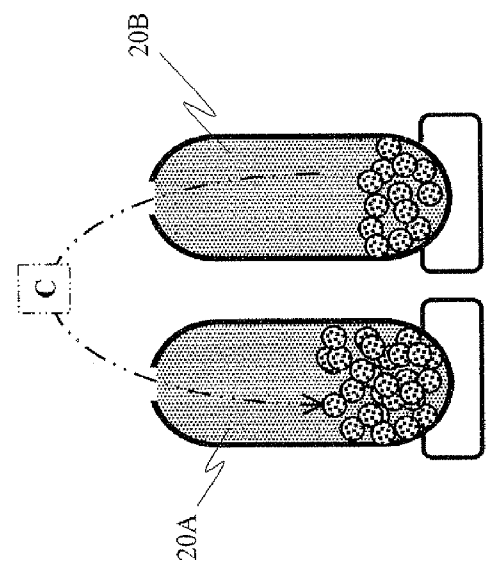
FIG. 6D is a conceptual representation of the paired containers of FIG. 6B after a system disruption has occurred.
Figure 6A:
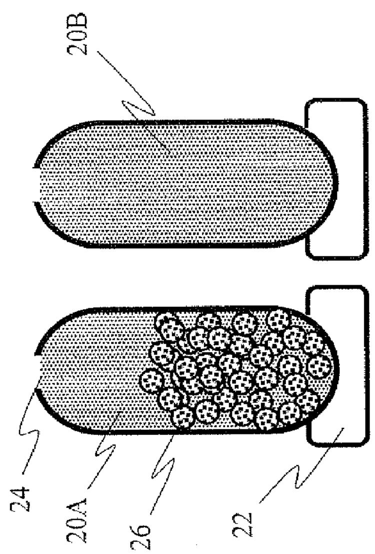
FIG. 6A is a conceptual representation of paired containers in which there is a storage container and a buffer container.

FIG. 6A is a conceptual representation of paired containers in which there is a storage container and a buffer container. Such embodiments solve the problem described above in which the system is disrupted. A storage container 20A and a receiving buffer container 20B, configured as a pair, are shown in FIG. 6A. Storage container 20A is the container that stores items 26 for the pair. Buffer container 20B is normally empty, and is used only for the purpose of reading the number of items 26 in storage container 20A.

Figure 6C:
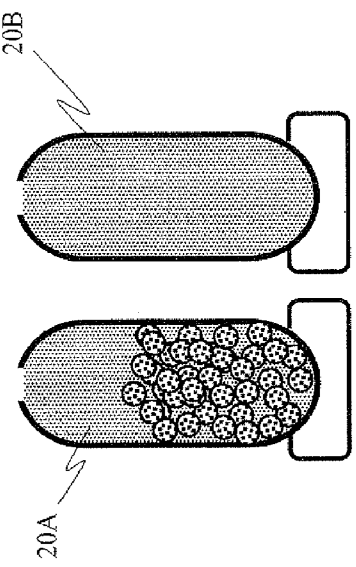
FIG. 6C is a conceptual representation of the paired containers of FIG. 6B after the storage container has been restored.

FIG. 6B is a conceptual representation of the paired containers of FIG. 6A after the items have been extracted from the storage container. When the system needs to determine the number of items 26 in storage container 20A, items 26 are extracted individually from storage container 20A, and inserted into buffer container 20B. When storage container 20A is empty, the number of productive extractions represents the number of items in storage container 20A. The system then restores the state of the pair by pouring all items 26 from buffer container 20B back into storage container 20A. FIG. 6C is a conceptual representation of the paired containers of FIG. 6B after the storage container has been restored.

FIG. 6D is a conceptual representation of the paired containers of FIG. 6B after a system disruption has occurred. After a system disruption occurs (prior to completion of restoring storage container 20A as described with regard to FIG. 6C), upon resuming operation, the system is in a state in which some of items 26 are in storage container 20A, some of items 26 are in buffer container 20B, and the number of productive extractions performed is lost. The system recovers from such a disruption by first pouring (depicted as extraction transfer C in FIG. 6D) all items 26 from buffer container 20B into storage container 20A, resetting the number of extractions to zero, and restarting the reading process. Since the containers are paired together, the system will also not lose the association between storage container 20A and buffer container 20B.

In some embodiments described herein, the system does not restore the state of storage container 20A at the end of the counting. Instead, the system designates buffer container 20B, which contains all items 26 at the end of the counting, as the new storage container, saving the step of pouring items 26 back into the original storage container 20A.

Upon starting the reading process, the identity of the storage container in the pair can be determined, without having to store an ID parameter, using the following simple algorithm:

(1) read the first of the two containers;

(2) if the count is not zero, this is the storage container; and (3) if the count is zero, then the other container is the storage container.

If both containers are empty, the algorithm will still produce the correct result.

Figures 7A, 7B, 7C:
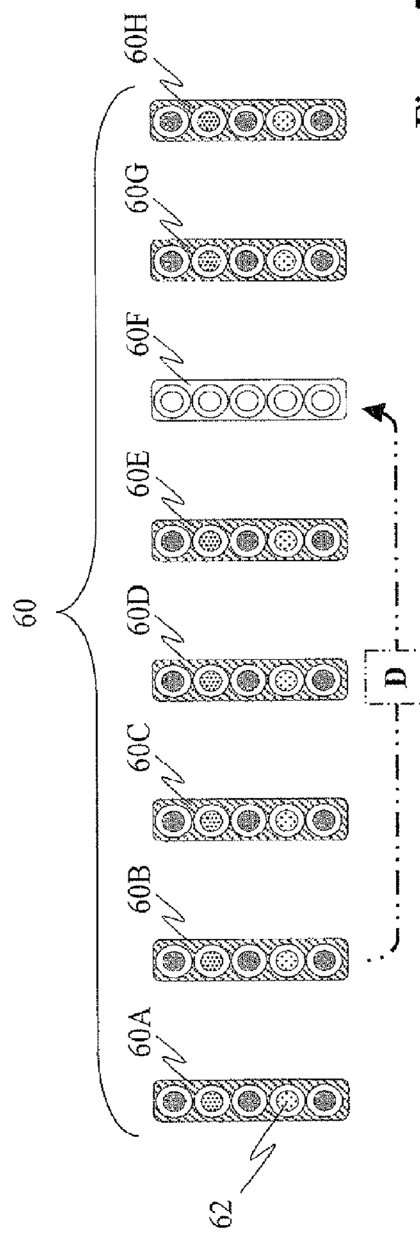
FIG. 7A is a conceptual representation of a system in which extracted containers from one reading process serve as receiving containers for a subsequent reading process.
FIG. 7B is a conceptual representation of the system of FIG. 7A after an extraction transfer.
FIG. 7C is a conceptual representation of the system of FIG. 7B after an extraction transfer.

FIG. 7A is a conceptual representation of a system in which extracted containers from one reading process serve as receiving containers for a subsequent reading process. A column array 60, of containers 62, is shown from a top-view perspective. Container columns in column array 60 are labeled with addresses 60A-60H. In the exemplary embodiment of FIG. 7A, there are five containers 62 shown in each of columns 60A-60H. Some of containers 62 may contain an unknown number of items 26 (represented by shading, and not explicitly shown in FIG. 7A).

The embodiment of FIG. 7A provides an enhancement of efficiency over the embodiment described above with regard to FIGS. 6A-D. As a consequence of the paired configuration of containers described above with regard to FIGS. 6A-D, 50% of the total number of container columns in a column array in the system cannot be used for storing information. These columns are the associated buffer containers 20B of such a column of containers. In the embodiment of FIG. 7A, containers 62 are unpaired. As a result, M−1 out of M container columns of column array 60 can store information, while the excluded container column is used for counting.

In FIG. 7A, column 60F is kept empty; all of containers 62 of column 60F are empty. If the system needs to determine the number of items 26 in one or more containers 62 of a given column (e.g., column 60B), the system uses corresponding containers 62 of empty column 60F as receiving containers. In a process identical to that described with regard to FIGS. 2 and 3, the system, moves items 26 individually from column 60B into column 60F (depicted as extraction transfer D in FIG. 7A), while counting the productive extractions. At the completion of extraction transfer D, column 60F has the exact number and arrangement of items originally in column 60B, and column 60B is left empty. FIG. 7B is a conceptual representation of the system of FIG. 7A after an extraction transfer.

In some embodiments described herein, empty column 608 becomes the receiving column for the next reading process. In FIG. 7B, a subsequent reading process is performed. If the system needs to determine the number of items 26 stored in column 60G, the system moves items 26 individually from column 60G into empty column 60B (depicted as extraction transfer E in FIG. 7B), while counting the number of productive extractions, leaving column 60G empty. Column 60G becomes the receiving column for the next reading process. FIG. 7C is a conceptual representation of the system of FIG. 7B after an extraction transfer.

As mentioned above in the Summary, in order for the system to correctly count physical items in a container, the system has to account for the possibility that items will be lost (e.g., due to errors in counting, evaporation, or leaks in the container). As an example, if the items are chicks, some of the chicks may manage to jump out of a port of an incubator. As another example, if the items are electrons in a memory cell, some electrons may disappear due to stress-induced leakage current. Such item volatility may degrade the data-retention capability of a container as a non-volatile storage device.

Figure 8:
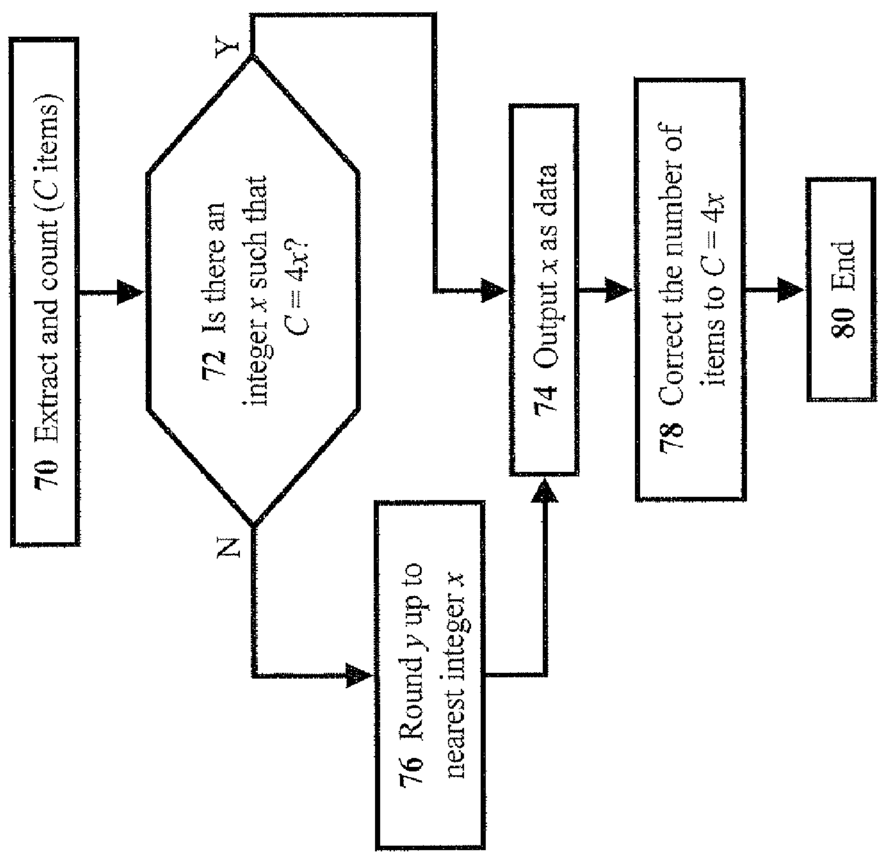
FIG. 8 is a simplified flowchart of a read-by-grouping (RBG) process.

FIG. 8 is a simplified flowchart of a read-by-grouping (RBG) process. The scheme of FIG. 8 relates to a system in which the numerical value represented by the items in a container is smaller than the number of items in the container. Every data unit is represented, in such an embodiment by a pre-defined bunch of two or more items, and the numerical value in the container is equal to the smallest amount of data units that is represented by the number of items found. This solves the problem of item volatility. In the exemplary embodiment of FIG. 8, four items are used to represent a single data unit. In such an embodiment, if a container needs to store the value “13”, the container ideally needs to contain 52 items, but 51 items will also be interpreted as “13”.

The RBG process starts with the system counting the number of items in a container, according to any of the methods described above with regard to FIGS. 1-7, and designates the count of items as “C” (Step 70). The system then checks whether C is a multiple of four (Step 72). If C=4x (where x is an integer value), then the system reports x (i.e., the number of items divided by four) as the count output (Step 74). If the number of items divided by four is not an integer (i.e., C/4≠x) in Step 72, then the system rounds the result (i.e., C/4=y, where y is a non-integer value) up to the nearest integer value x (Step 76), and reports x as the count output (Step 74). The system then corrects the number of items in the container to a multiple of four (i.e., C=4x) (Step 78), and the process ends (Step 80). By doing so, the system prevents an accumulation of error, and thus, compensates for containers that leak out items slowly over time.

As described above with regard to previous drawings, there are two ways for extracting items from and inserting items into a container:

(1) a “one-by-one” extraction/insertion method as described with regard to FIG. 2; and (2) a “pouring” method (using a physical force such as gravity) as described with regard to FIG. 4 for inserting items into a container, and with regard to FIG. 5 for extracting items from a container.

As explained above, the pouring method is much faster than the one-by-one method, but the pouring method cannot be accurately controlled. The pouring method can be used for counting only when fully filling or fully emptying a container, since the items can be counted when flowing into and out of the container as explained above.

Figures 9A, 9B, 9C:
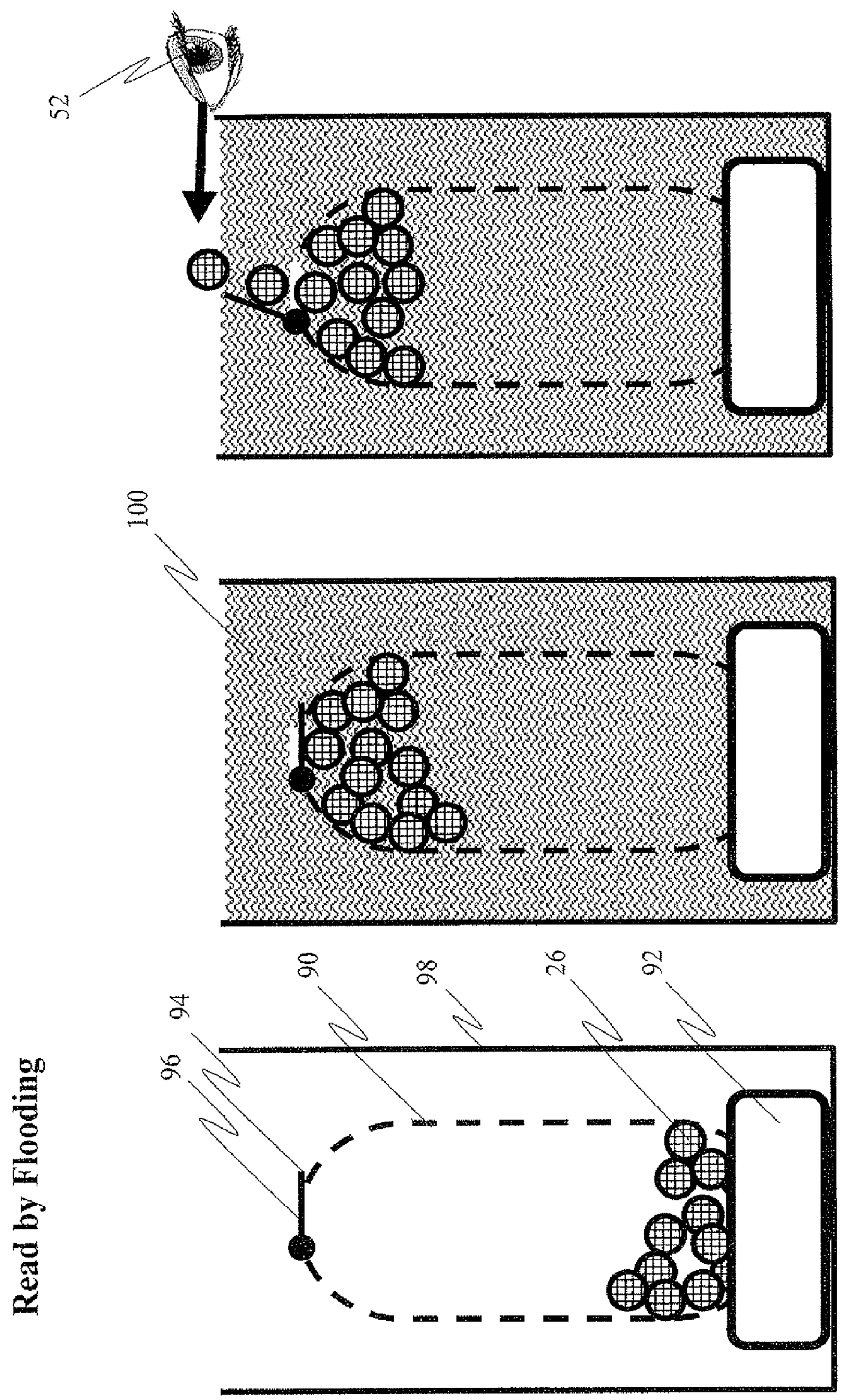
FIG. 9A is a conceptual representation of a partially-full container that is read by bath flooding (RBBF)
FIG. 9B is a conceptual representation of the container of FIG. 9A after being flooded during the RBBF process.
FIG. 9C is a conceptual representation of the container of FIG. 9B after the port lid has been opened during the RBBF process.

In some embodiments described herein, items can be extracted from a container by pouring out the items, without turning the container upside-down (as described with regard to FIG. 5). FIG. 9A is a conceptual representation of a partially-full container that is read by bath flooding (RBBF). A perforated container 90, having a pedestal 92, a port 94, and a port lid 96, is shown in FIG. 9A. An unknown number of items 26 are shown in perforated container 90. Perforated container 90 is situated in a larger, non-perforated bath 98.

In such embodiments, perforated container 90 does not allow items 26 to enter or leave through the walls of container 90, but does allow a fluid, having a greater specific gravity than items 26, to enter container 90 through the walls of container 90, causing items 26 to float up toward port 24. Alternatively, instead of being perforated, container 90 may also be made out of a suitably-porous material. FIG. 9B is a conceptual representation of the container of FIG. 9A after being flooded during the RBBF process. A fluid 100 (depicted as the shaded region in bath 98) is shown filling bath 98. Items 26 float upward, and are pressed against port lid 96 of container 90, which remains closed.

FIG. 9C is a conceptual representation of the container of FIG. 9B after the port lid has been opened during the RBBF process. Items 26 in container 90 are counted by inspection mechanism 52 after being released when port lid 96 is opened. After the last item 26 has left container 90, and has been counted, the system can drain fluid 100 from bath 98, which also drains container 90, leaving container 90 empty and ready to be used again. Such embodiments enable the system to use all four counting modes mentioned above: the one-by-one insertion (CBM/RBF) method, the one-by-one extraction (CBM/RBF) method, the pouring-insertion (WBFE) method, and the flooding-extraction (RBBF) method.

As an example, a container of oranges can be flooded with water, and the oranges can be counted while flowing out of the container. As another example, a voltage bias can be applied across a charged capacitor, causing all the charged particles to flow out of the capacitor. The charged particles can be counted as current impulses.

When the containers are arranged in one- or two-dimensional arrays (such as the containers shown in FIGS. 3 and 7), it may be practical, for production considerations, to arrange a plurality of containers in one "common" bath. A group of containers in a common bath are referred to as a "block" herein. The flooding of a bath will flood all the containers in that bath, and will allow reading the content of the containers individually, without needing to repeat the RBBF process for each container. Since flooding the bath may be a rather slow operation, such "block flooding" will accelerate the reading process of a large number of containers.

Clearly, such a method of block flooding suggests that the RBBF process will be performed on a block-by-block basis, where all the containers of a given block are read during RBBF process. The reading of the containers can be performed in parallel, if the system has a plurality of inspection mechanisms 52. Alternatively, the reading of the containers can be performed in sequence, if inspection mechanism 52 has to move from container to container, and each container is opened when inspection mechanism 52 is ready to count outgoing items 26.

It is important to note that in such a block-flooding method, the system cannot read and write different containers in the same block at the same time. If both the storage containers and the receiving containers are in the same block (such as in the embodiments described with regard to FIG. 6), the system must complete the RBBF process first (while storing the count data in a temporary storage area, such as another block of containers), then drain the bath (in preparation for writing), and then write the data into receiving containers by reading the temporary storage area. The reading operation is completed only after completion of the extraction cycle and the insertion cycle.

Figure 10:
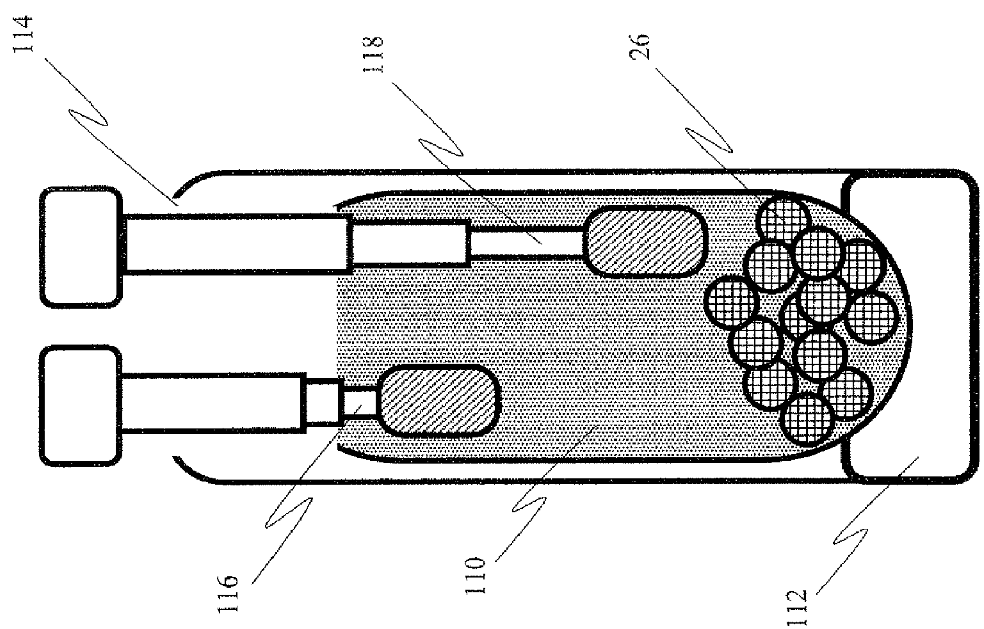
FIG. 10 is a conceptual representation of a container that accommodates a dual-extraction tool.

In some embodiments described herein, items 26 can be extracted from a container by more than one extraction tool in order to accelerate the counting process. FIG. 10 is a conceptual representation of a container that accommodates a dual-extraction tool. A container 110 having a pedestal 112 and a port 114 are shown. An extraction apparatus, similar to that of FIG. 2A, having two extraction tools 116 and 118 is also shown in FIG. 10. Each extraction tool can be operated independently so that the system can extract items 26 from container 110 at twice the rate of a single-extraction tool. Alternatively, container 110 can also be configured with multiple ports 114 so that each extraction tool operates through its own port 114.

Figure 11:
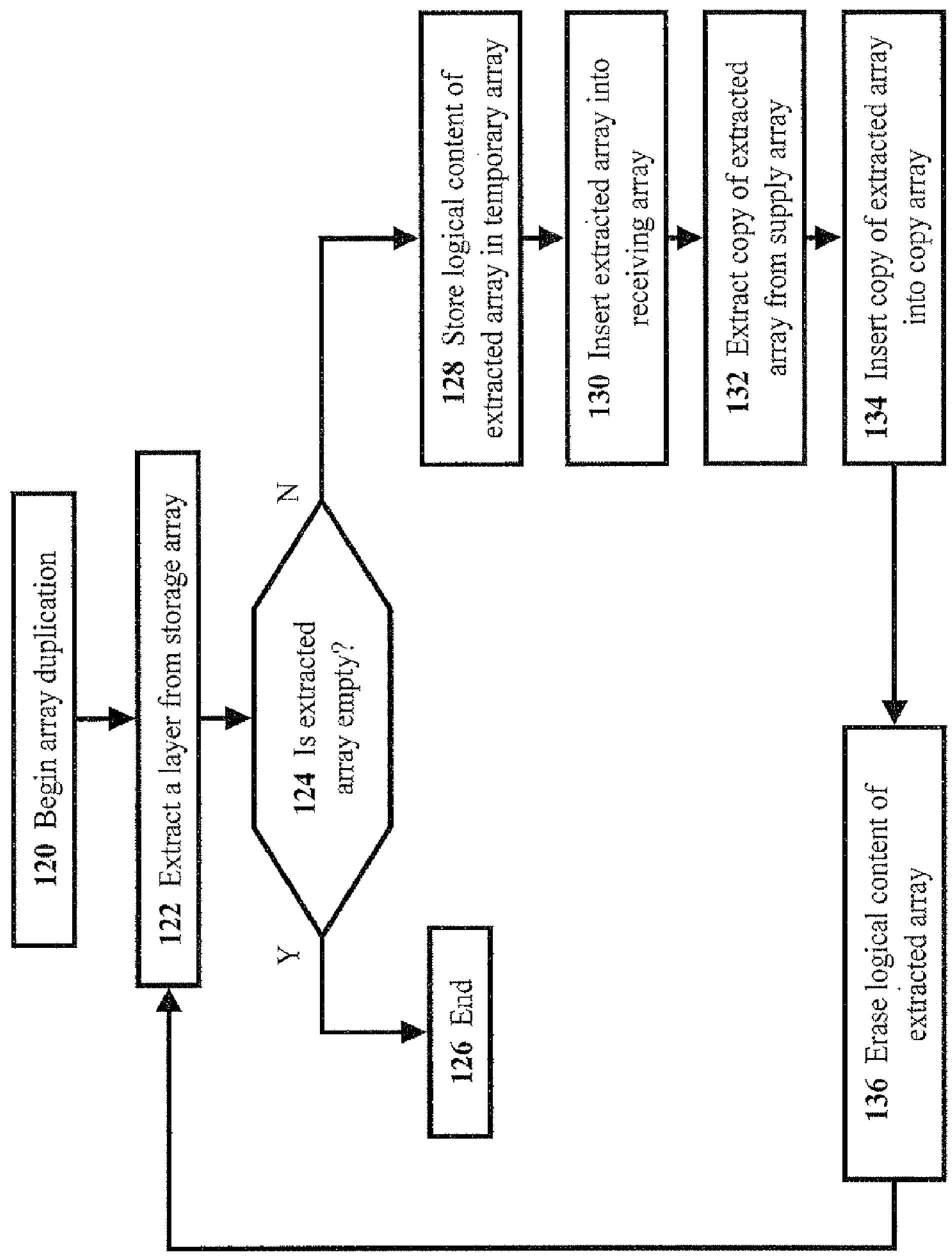
FIG. 11 is a simplified flowchart of a container-duplication (CD) process.

FIG. 11 is a simplified flowchart of a container-duplication (CD) process. The scheme of FIG. 11 relates to the process of copying a container, or an array of containers, from a storage array to a copy array, while preserving the content of the storage container. In the following description, an "extracted array" refers to the array from which items are extracted, and a "storage array" refers to the array to which the items are stored.

A storage array is selected to be duplicated into a copy array having the same dimensions as the storage array (Step 120). A layer is extracted from the storage array (Step 122). The system then inspects the extracted array to see whether the array is empty (Step 124). If the extracted array is empty, then the copy array and the storage array are identical, and the CD process comes to an end (Step 126).

If the extracted array is not empty in Step 124, then the logical content of the extracted array is stored in a temporary array (e.g., a RAM of a computer) (Step 128). The extracted array is then inserted into a receiving array (Step 130). A copy layer, which is identical to the extracted array, is extracted from a supply array using the temporary array to define the supply containers that need to "contribute" an item (Step 132). The supply array includes containers in which each container contains a practically unlimited number of items.

The new extracted array, which is identical to the array that has been moved from the storage array to the receiving array, is now inserted into the copy array (Step 134). The logical value of the extracted array is then erased from the temporary array (Step 136). The system then proceeds to extract another layer from the storage array (Step 122).

For situations in which a disruption occurs during the CD process, causing the system to lose the content of the last extracted layer that is in the temporary array, the system restores the receiving array into the storage array, empties the copy array, and starts the CD process from the beginning without losing data.

Techniques for Counting Particles (Electrons and Charge Particles)

This overview covers a counting method based on the ability of the system to positively detect that a container is empty. Reading is performed by counting the number of extractions until the container is empty, and writing is performed by emptying the container, and then counting the number of insertions of electrons. Counting the number of insertion of electrons is described in Forbes '104 and Forbes '896. Counting the number of extractions of electrons is described below:

A conventional technique for counting single-electron differences involves a system of silicon quantum dots (or nanodots) (e.g., 50-100 Å diameter) doped with phosphorus at a surface of a wafer covered with silicon dioxide (~40-50 Å thick to provide high coupling to the Si body and also high retention). The Si nanodots are covered with a thin layer (e.g., ~10 Å thick) of $SiO_2$ to suppress the surface state effects.

In such a system, it is possible to fully deplete the electrons in the nanodot (i.e. empty the container). The mechanism is similar to CIS-pinned diode depletion (where CIS stands for CMOS image sensor) (see Yang et al., U.S. Pat. No. 6,982,403). The free electrons in the nanodot which originate from P atoms are bonded weakly and are easily extracted (e.g., 0.2

V potential on an atomic-force microscope (AFM) tip, see Makihara et al. in *Thin Solid Films,* 2006, v. 508, no. 1-2, p. 186-189).

So, the steps of extracting electrons, one by one, from the nanodot container is performed by applying voltage steps (or increment) of 0.2 V each. Each voltage increment will yield one electron, as long as there are free electrons in the conductive band. Once the conductive band is empty from electrons, additional increments of 0.2 V will not yield an electron, and the extraction will be non-productive (like an empty basket after all its items have been extracted).

In order to clarify all aspects of such a technique, it should be noted that in order to extract additional electrons, it is necessary to apply a much higher increment (e.g., ~1 V) because the additional electrons will originate from the valence band (see Makihara et al.). An important aspect of such a technique is maintaining uniform P-atom concentration in the Si nanodots.

An AFM tip with a Kelvin probe or a capacitive probe (i.e., scanning capacitance microscope (SCM)) may be used to detect single-electron differences for counting during electron extraction or injection. A voltage sweep is applied to the AFM or SCM tip, causing the surface potential to change stepwise with respect to the probe tip due to multi-step electron injection into and extraction from the nanadot. Such a response profile is a type of "Coulomb staircase", associated with single-electron transistors (SETs), which are known in the art of integrated electronics (see http://snowmass.stanford.edu/"shimbo/set.html and Matsumoto et al., *Japanese Journal of Applied Physics,* 34, 2B, 1387 (1995)).

Employing such techniques in counting methods described herein involves:

(1) emptying all containers (i.e. nanodots) by applying a positively-biased voltage pulse (e.g., 0.2 V-1 V);

(2) estimating the number of injected electrons by ramping the voltage on a negatively-biased probe tip;

(3) counting the steps in the associated surface-potential profile;

(4) estimating the number of extracted electrons by ramping the voltage on a positively-biased probe tip from 0 V to 0.2 V; and (5) counting the steps in the associated surface-potential profile.

Control of the number of P atoms in each of the nanodots is an important aspect of such a technique in order to determine that the containers are empty.

These counting techniques can be used in various charge containers or storage devices. In sum, while the present invention has been described with respect to a limited number of embodiments, it will be appreciated that equivalents thereof are possible and variations, modifications, and other applications of such embodiments may be made. Accordingly, the claims that follow are not limited to the embodiments described herein.

The invention claimed is:

1. A method for counting electrons in storage cells in an array of at least two storage cells, the method comprising the steps of, (a) providing a storage array of at least two storage cells, each of said at least two storage cells containing an unknown amount of electrons;

(b) providing a receiving array of at least two receiving cells, wherein said at least two receiving cells initially contain no electrons;

(c) extracting a layer of said electrons from said storage array of cells;

(d) inserting said layer into corresponding locations in said receiving array;

(e) repeating said steps of extracting and inserting while at least one of said at least two storage cells is not empty;

(f) counting, for each said storage cell in said storage array, a productive-extraction amount; and (g) reporting, for at least some of said at least two storage cells, said productive-extraction amount from said each storage cell, wherein the method is executed by a circuit.

2. The method of claim 1, wherein said step of extracting is performed by extracting said electrons from a respective port in said each storage cell.

3. The method of claim 1, wherein said step of inserting is performed by inserting said electrons into a respective port in said each receiving cell.

4. The method of claim 1, the method further comprising the step of:

(h) restoring said electrons from said at least two receiving cells in said receiving array into corresponding storage cells in said storage array.

5. The method of claim 1, wherein said receiving array is a dedicated receiving array.

6. The method of claim 1, wherein said storage array is an array of cells in a non-volatile memory device.

7. The method of claim 1, the method further comprising the step of:

(h) attracting individual said electrons in said at least two storage cells to an extraction mechanism.

8. The method of claim 1, the method further comprising the step of:

(h) storing an identity of said storage array in a non-volatile memory device.

9. The method of claim 8, the method further comprising the step of:

(i) recovering said identity upon recovery from a system failure that erases said productive-extraction amount.

10. The method of claim 1, the method further comprising the step of:

(h) subsequent to said step of counting, detecting when said layer is empty.

11. The method of claim 1, the method further comprising the step of:

(h) pairing a respective dedicated receiving cell to said each storage cell.

12. The method of claim 1, the method further comprising the step of:

(h) converting said storage array, in an initial counting operation, to said receiving array in a subsequent counting operation.

13. The method of claim 1, wherein a plurality of said electrons is used to represent a single countable unit.

14. A method for counting electrons in storage cells in an array of at least two storage cells of a non-volatile memory device, the method comprising:

identifying a storage array of at least two storage cells, each of said at least two storage cells containing an unknown amount of electrons;

providing a receiving array of at least two receiving cells, wherein said at least two receiving cells initially contain no electrons;

extracting electrons from said storage array of cells;

inserting said extracted electrons into corresponding locations in said receiving array;

repeating said extracting and inserting while at least one of said at least two storage cells is not empty;

counting, for each said storage cell in said storage array, a productive-extraction amount; and identifying, for at least some of said at least two storage cells, said productive-extraction amount from said each storage cell, the method being executed by a circuit.

15. The method of claim 14, further comprising, storing an identity of said storage array at a location in the non-volatile memory device and recovering said identity upon recovery from a system failure that erases said productive-extraction amount.

16. The method of claim 14, wherein each storage cell is a nanodot.

17. The method of claim 14, wherein extracting electrons from said storage array of cells is facilitated by applying voltage steps.

18. The method of claim 17, wherein each voltage step is incremented for extracting an additional one of the electrons.

* * * * *